(12) United States Patent
Imboden et al.

(10) Patent No.: US 12,282,298 B2
(45) Date of Patent: Apr. 22, 2025

(54) HOROLOGICAL MOVEMENT PROVIDED WITH AN OSCILLATOR COMPRISING A PIEZOELECTRIC SPRING

(71) Applicant: The Swatch Group Research and Development Ltd, Marin (CH)

(72) Inventors: Matthias Imboden, St-Blaise (CH); Alexandre Haemmerli, Neuchâtel (CH); Alexandre Didier, Erlach (CH); Cédric Nicolas, Neuchâtel (CH)

(73) Assignee: The Swatch Group Research and Development Ltd, Marin (CH)

( * ) Notice: Subject to any disclaimer, the term of this patent is extended or adjusted under 35 U.S.C. 154(b) by 416 days.

(21) Appl. No.: 17/662,691

(22) Filed: May 10, 2022

(65) Prior Publication Data
US 2022/0390901 A1 Dec. 8, 2022

(30) Foreign Application Priority Data
Jun. 2, 2021 (EP) .................................... 21177468

(51) Int. Cl.
*G04C 3/12* (2006.01)
*G04F 5/06* (2006.01)
*H10N 10/80* (2023.01)

(52) U.S. Cl.
CPC ............... *G04C 3/12* (2013.01); *G04F 5/063* (2013.01); *H10N 10/80* (2023.02)

(58) Field of Classification Search
CPC ...................................................... G04C 3/12
See application file for complete search history.

(56) References Cited

U.S. PATENT DOCUMENTS

| 7,922,385 B2 * | 4/2011 | Nagao .................... H02N 2/123 368/125 |
| 8,721,169 B2 * | 5/2014 | Schafroth ............ G04B 17/066 368/171 |

(Continued)

FOREIGN PATENT DOCUMENTS

| CH | 713332 A2 | 6/2018 |
| CN | 1347520 A | 5/2002 |

(Continued)

OTHER PUBLICATIONS

European Search Report issued Nov. 3, 2021 in European Application 21177468.2, filed on Jun. 2, 2021 (with English Translation of Categories of cited documents), 3 pages.

(Continued)

*Primary Examiner* — Edwin A. Leon
*Assistant Examiner* — Sean R Brannon
(74) *Attorney, Agent, or Firm* — Oblon, McClelland, Maier & Neustadt, L.L.P.

(57) ABSTRACT

A horological movement includes an analogue time display, a gear train, a barrel driving the analogue display via the gear train, and an oscillator formed of a resonator, including a balance and a piezoelectric spring, and a mechanical escapement coupling the balance to the gear train. This horological movement further includes an electric energy source which is associated with the electronic control circuit, which is arranged to be able to control the application of an electrical supply voltage to the piezoelectric spring to excite the oscillator to obtain a functional oscillation of the resonator and then to maintain this functional oscillation. The mechanical escapement is an escapement for counting the alternations of the functional oscillation, to pace the running of the horological movement, without the resonator being able to receive from the barrel via this mechanical escape- (Continued)

ment enough mechanical energy to maintain the functional oscillation.

13 Claims, 7 Drawing Sheets

(56) References Cited

U.S. PATENT DOCUMENTS

| | | | |
|---|---|---|---|
| 9,188,957 B2* | 11/2015 | Willemin | G04C 3/04 |
| 10,969,745 B2* | 4/2021 | Haemmerli | G04C 3/047 |
| 10,983,479 B2* | 4/2021 | Haemmerli | G04C 3/047 |
| 2008/0212415 A1* | 9/2008 | Nagao | G04C 3/12 |
| | | | 310/329 |
| 2013/0051191 A1* | 2/2013 | Schafroth | G04C 3/047 |
| | | | 368/175 |
| 2013/0107677 A1* | 5/2013 | Willemin | G04C 3/067 |
| | | | 368/200 |
| 2015/0234353 A1 | 8/2015 | Hessler et al. | |
| 2019/0079453 A1* | 3/2019 | Haemmerli | G04B 17/066 |
| 2019/0079460 A1* | 3/2019 | Haemmerli | G04B 17/066 |
| 2020/0103826 A1 | 4/2020 | Tombez et al. | |
| 2020/0103827 A1* | 4/2020 | Tombez | G04C 3/047 |

FOREIGN PATENT DOCUMENTS

| | | |
|---|---|---|
| CN | 108241281 A | 7/2018 |
| CN | 109946948 A | 6/2019 |
| CN | 110579954 A | 12/2019 |
| EP | 1 164 441 A1 | 12/2001 |
| EP | 2 613 205 A2 | 7/2013 |
| EP | 2 908 185 A1 | 8/2015 |
| EP | 3 540 528 A1 | 9/2019 |
| EP | 3 629 103 A1 | 4/2020 |
| JP | 01048565 A1 | 6/2003 |

OTHER PUBLICATIONS

Chinese Office Action and Search Report issued Feb. 29, 2024 in Chinese Patent Application No. 202210629526 (with English translation), 12 pages.

* cited by examiner

HOROLOGICAL MOVEMENT PROVIDED WITH AN OSCILLATOR COMPRISING A PIEZOELECTRIC SPRING

CROSS-REFERENCE TO RELATED APPLICATION

This application claims priority to European Patent Application No. 21177468.2 filed on Jun. 2, 2021, the entire disclosure of which is hereby incorporated herein by reference.

TECHNICAL FIELD OF THE INVENTION

The present invention relates to a horological movement comprising a barrel and an analogue time display, which is driven by the barrel via a gear train, as well as a balance-spring to control the running of the horological movement. The spring is of the piezoelectric type with electrodes arranged on the two lateral surfaces.

TECHNOLOGICAL BACKGROUND

A horological movement is known from patent U.S. Pat. No. 9,721,169 comprising an oscillator of the balance-spring type with a piezoelectric spring provided with electrodes connected to a variable capacitance in order to be able to vary the rigidity of the spring and thus adjust its natural frequency to increase the precision of the time display.

Patent applications EP 3 540 528 and EP 3 629 103 respectively describe a method for regulating the average frequency of a balance-spring and a method for synchronising the frequency of a balance-spring using a piezoelectric spring connected to an electronic control unit provided with a quartz oscillator.

SUMMARY OF THE INVENTION

The object of the present invention is to modify a horological movement of the mechanical type so as to increase its power reserve and allow to improve its running precision, without however renouncing a balance-spring to clock the running of the horological movement, in particular the drive of its analogue display device.

To this end, the present invention relates to a horological movement comprising an analogue time display, a gear train, a barrel driving the analogue display via the gear train, and an oscillator formed of a resonator, comprising a balance and a piezoelectric spring, and a mechanical escapement coupling the balance to the gear train, the piezoelectric spring being formed at least partially of a piezoelectric material and comprising at least two electrodes, at least one electrode of which is connected to an electronic control circuit. The piezoelectric material and said at least two electrodes are arranged so as to allow the application, managed by the electronic control circuit, of an electrical stress on the piezoelectric spring. The electronic control circuit is arranged to be able to be connected to an electric energy source and to be able to manage the application, at least occasionally, of a power supply voltage to said at least one electrode so as to electrically excite the oscillator to obtain a functional oscillation of the resonator and then to maintain this functional oscillation. In addition, the mechanical escapement is configured so as to be an escapement for counting the alternations of the functional oscillation, thus in order to pace the running of the horological movement, without the resonator being able to receive from the barrel via this escapement enough mechanical energy to maintain a functional oscillation. The oscillator according to the invention is therefore an electromechanical oscillator having a power supply and a counting device formed by a mechanical escapement.

Thanks to the features of the invention, the analogue time display is driven by a barrel, that is to say by a source of mechanical energy specific to a mechanical movement, and its operation is clocked by a mechanical escapement associated with a resonator of the balance-spring type, while the electromechanical oscillator is power supplied independently by an electric energy source allowing an electronic control circuit of this electromechanical oscillator to apply at least occasionally a voltage power supply between two electrodes of the piezoelectric spring, so as to activate and then electrically maintain an oscillation of the resonator forming the electromechanical oscillator. The electromechanical oscillator is thus formed by a resonator of the balance-spring type having a piezoelectric spring. In a preferred embodiment, this oscillator comprises a mechanical escapement which is provided only as a counter and the oscillator comprises or is associated with an electronic control circuit which is arranged to manage a power supply of the piezoelectric spring so as to maintain the resonator alone.

In the preferred embodiment, the electromechanical oscillator is therefore independent of the barrel as regards the power supply, so that the gear train can be arranged to optimise its consumption of mechanical energy while maintaining a torque sufficient for the analogue display indicators so as to ensure good drive of said indicators. The power reserve, to the extent that the electric energy is sufficient to maintain the electromechanical oscillator, is consequently greatly increased.

In an advantageous variant of the preferred embodiment, the electronic control circuit, which alone manages the power supply of the piezoelectric spring, is arranged so as to be able to regulate the supply voltage so as to maintain the amplitude of the resonator oscillation substantially constant. Thus, the isochronism is improved and the precision of the horological movement is increased, without an additional electronic oscillator.

BRIEF DESCRIPTION OF THE FIGURES

The invention will be described below in more detail using the appended drawings, given by way of non-limiting examples, wherein.

DETAILED DESCRIPTION OF THE INVENTION

With reference to the Figures, an embodiment of a horological movement according to the invention, as well as the general arrangement of a watch will be described according to the invention.

Figure 1:
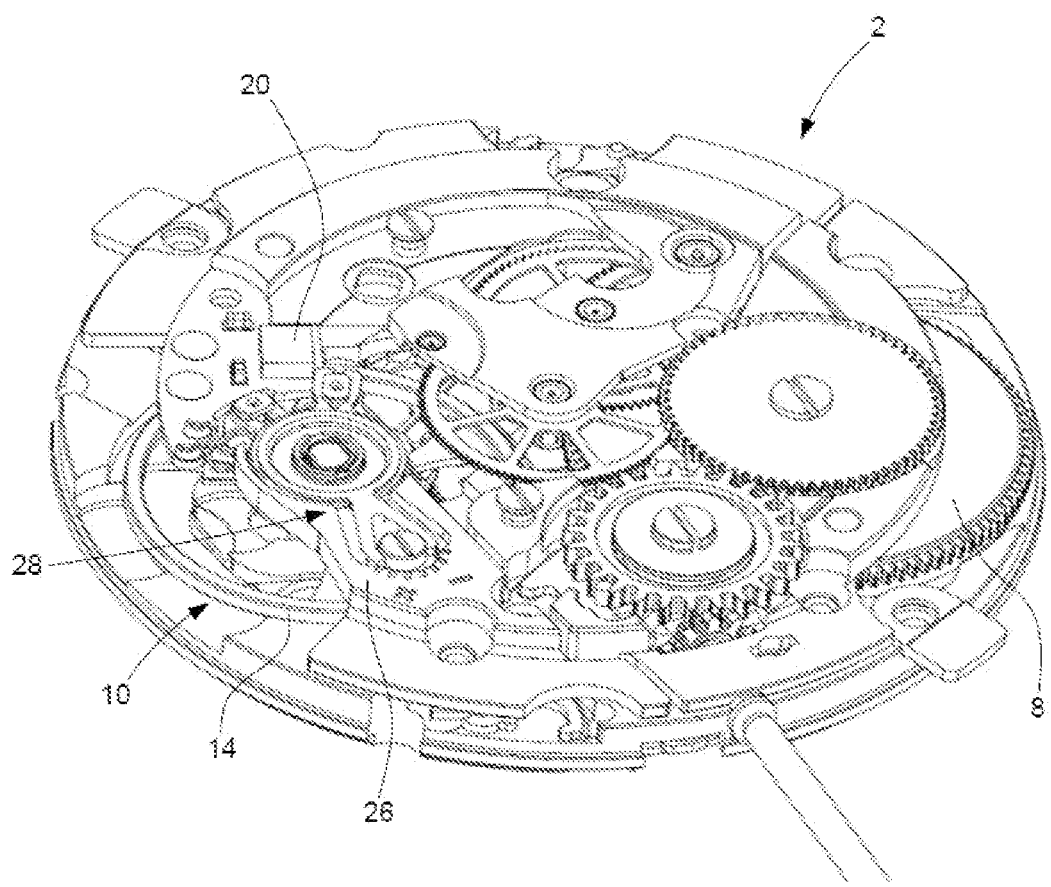
FIG. 1 is a perspective view of an embodiment of a horological movement according to the invention (without the oscillating mass provided for winding the barrel)
Figure 2:
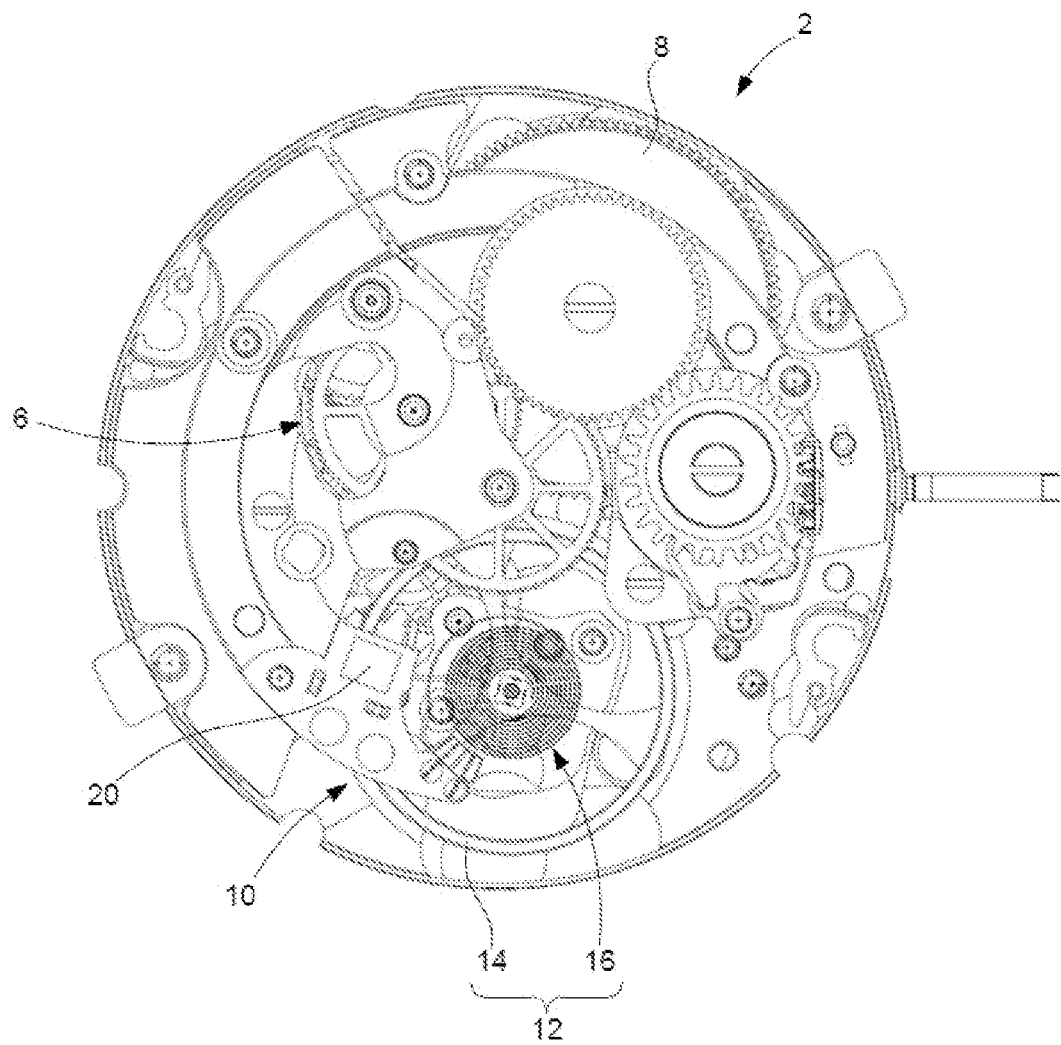
FIG. 2 is a bottom view of the horological movement of FIG. 1, from which the balance bridge and the index-assembly have been removed.

The horological movement 2 comprises an analogue time display 4, a gear train 6, a barrel 8 driving the analogue display via the gear train, and an electromechanical oscillator 10 formed of a resonator 12, comprising a balance 14 and a piezoelectric spring 16, and a mechanical escapement 18A coupling the balance to the gear train. The horological movement is provided with an oscillating mass 24 (not shown in FIGS. 1 and 2, but in FIG. 3) used to wind the barrel. The balance is pivoted in a balance bridge 26, this bridge carrying an index-assembly 28 used to adjust the oscillation frequency of the resonator 12, as is customary in horological movements of the mechanical type.

Figure 5:
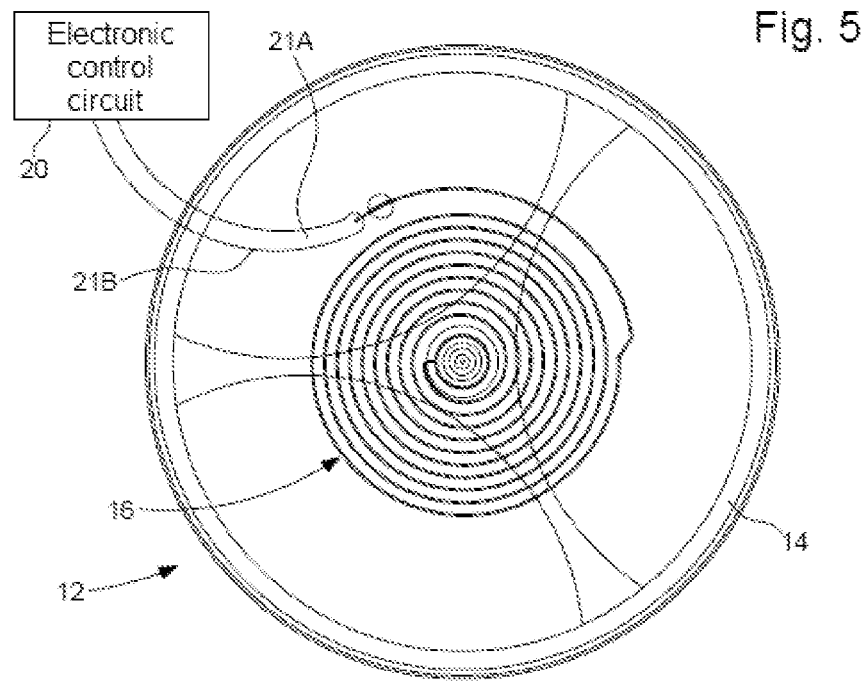
FIG. 5 is an enlarged and schematic view of the resonator forming the electromechanical oscillator incorporated in the embodiment of the horological movement of FIG. 1.
Figure 6:
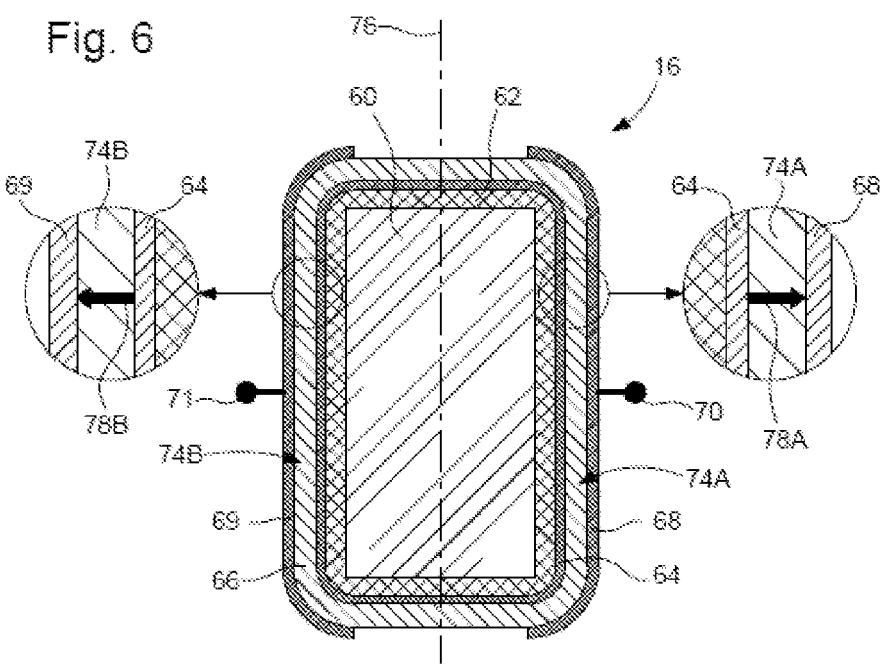
FIG. 6 is a cross section of the piezoelectric spring forming the resonator of FIG. 5.

In general, the piezoelectric spring is formed at least partially of a piezoelectric material and comprises at least two electrodes, at least one electrode of which is connected to an electronic control circuit 20. In FIG. 5 are shown the resonator 12 and the electronic control circuit 20 to which two external electrodes 68 and 69 of the piezoelectric spring 16 are connected by two electrical connections 21A and 21B. A cross section of the piezoelectric spring 16 is shown in FIG. 6 in a non-limiting manner. This spring comprises a central body 60 made of silicon, a layer of silicon oxide 62 deposited on the surface of the central body so as to thermally compensate the spring, a first conductive layer 64 deposited on the layer of silicon oxide, and a piezoelectric material deposited in the form of a piezoelectric layer 66 on the first conductive layer 64. In a particular variant, the piezoelectric layer consists of an aluminium nitride crystal formed by a growth of this crystal from the first conductive layer and perpendicularly thereto. Two external electrodes 68 and 69, formed by a second partial conductive layer on the piezoelectric layer, are arranged respectively on the two lateral sides of the spring and are connected to two respective terminals 70 and 71 of the electronic control circuit 20. Thus, the piezoelectric layer 66 comprises a first part 74A and a second part 74B which respectively extend over the two lateral sides of the central body 60 and which have, by their growth from the first conductive layer 64, respective crystallographic structures which are symmetrical relative to a median plane 76 parallel to these two lateral sides. Thus, in the two lateral parts 74A and 74B, the piezoelectric layer 66 has two respective piezoelectric axes 78A and 78B perpendicular to this piezoelectric layer and of opposite directions.

For the same overall mechanical stress exerted on the piezoelectric spring 16 (spring in contraction or in extension relative to its rest position), an inversion of the sign of the induced voltage occurs between the internal electrode 64, formed by the first conductive layer, and each of the two outer lateral electrodes 68 and 69 since, when the spring contracts or extends from its rest position, there is a reversal of the mechanical stress in the first and second lateral parts 74A and 74B, that is to say that one of these two parts undergoes compression while the other of these parts undergoes elongation/traction, and vice versa.

It follows from the above considerations that local induced voltages in the first and second lateral parts 74A, 74B have, along a geometric axis perpendicular to the two lateral sides, the same polarity, so that a single common internal electrode 64 is sufficient, this common internal electrode extending from the two lateral sides of the central body 60. It is therefore possible to recover an induced voltage between the two external electrodes 68 and 69, which corresponds to the addition of the two local induced voltages (in absolute values) which are generated respectively in the first and second parts 74A and 74B of the piezoelectric layer 66. It also results from these considerations that a certain voltage can be applied between the two electrodes 68 and 69 to actively constrain the spring during an excitation of the resonator 12 and during a power supply for maintaining an oscillation of this resonator. It will be noted that the internal electrode, formed of the first conductive layer 64, does not need its own electrical connection with the electronic control circuit 20 or with the ground of the horological movement, although this is not excluded.

In the context of the invention, the piezoelectric material 66 and the two electrodes 68 and 69 are arranged so as to allow the application, controlled by the electronic control circuit 20, of an electrical stress on the piezoelectric spring so as to excite the electromechanical oscillator 10, so that the resonator 12 begins to oscillate and obtain an oscillation with a functional amplitude, and then to maintain this functional oscillation. To this end, the electronic control circuit 20 is connected to an electric energy source 30 allowing to apply a power supply voltage, between the external electrodes 68 and 69, the value of which is managed by this electronic control circuit. More generally, the electronic control circuit 20 is arranged to be able to control the application, at least occasionally, of a power supply voltage to at least one of the two external electrodes 68 and 69, so as to electrically excite the electromechanical oscillator 10 to obtain an oscillation of the resonator with a functional amplitude, called functional oscillation, and then to maintain this functional oscillation. In particular, it is provided to supply driving impulses to the electromechanical oscillator 10, that is to say energy impulses, which allow to maintain a functional oscillation of the resonator 12. The frequency of these driving impulses depends in particular on their duration and their electrical voltage. In particular, such driving impulses can be dimensioned so that they occur once during each alternation or once per period of oscillation of the resonator.

The mechanical escapement 18 is configured so as to be an escapement for counting the alternations of the functional oscillation, in order to be able to pace the running of the horological movement, without the resonator being able to receive from the barrel via this escapement sufficient mechanical energy to maintain the functional oscillation. For an oscillation to be functional, it must at least have sufficient amplitude to allow the lever of the mechanical escapement to move back and forth (alternating movement) between two rest positions wherein the balance forming the resonator is released, that is to say not mechanically coupled to the lever.

Figure 4:
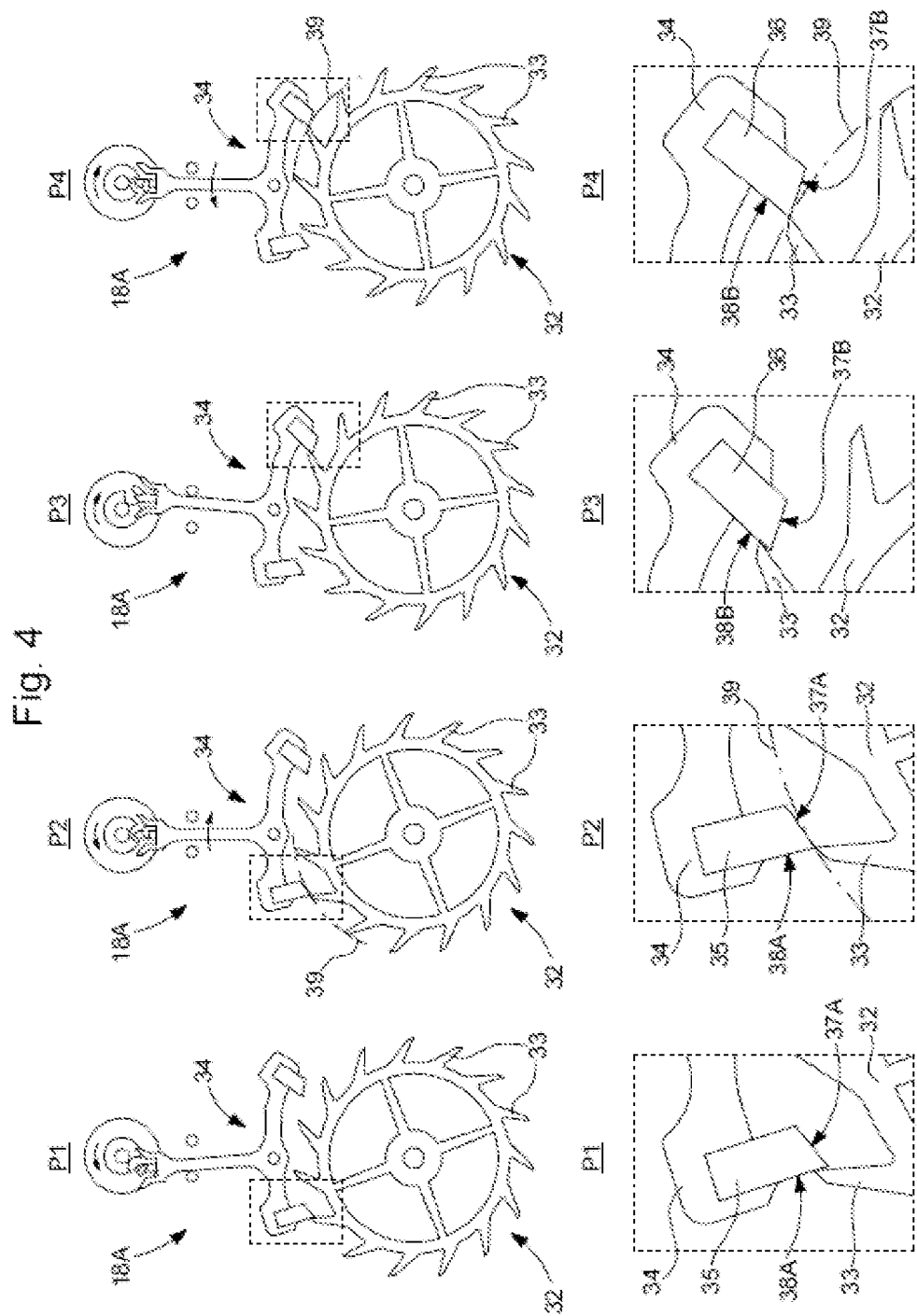
FIG. 4 partially shows an embodiment of a mechanical escapement, in various specific states, provided to form an electromechanical oscillator incorporated in the embodiment of the horological movement of FIG. 1.

With reference to FIG. 4, an embodiment of an escapement 18A will be described according to the invention which forms the output device of the electromechanical oscillator 10 (note that it is possible to consider the counter escapement as part of or associated with the oscillator). The escapement 18A is a Swiss lever type escapement, the lever 34 of which is modified so that its two pallets 35 and 36 each have, at their free end intended to momentarily stop an escape wheel 32, an end surface 37A, respectively 37B whose point of 'contact' with a geometric circle 39 circumscribed to the escape wheel, when the pallet in question is in a corresponding angular position (that is to say in an angular position wherein this pallet 'touches' the circumscribed geometric circle 39 without penetrating it), is located at the junction between this end surface 37A, 37B and a lateral surface 38A, respectively 38B of said considered pallet which forms a stop for the teeth 33 of the escape wheel. Thus, the escapement is configured so that, in normal operation, no tooth 33 slides along the two end surfaces 37A, 37B of the two respective pallets and thus no mechanical impulse (no momentary mechanical force torque) is supplied to the lever via these two end surfaces, as is the case in a conventional Swiss lever escapement. At most, said junction (between the end surface and the lateral surface of each pallet) can slide successively, at each two steps taken by the escape wheel, on the end of each tooth of this escape wheel and thus the escape wheel can supply at each step a small amount of mechanical energy to the lever, which is insufficient to be able to maintain a functional oscillation of the resonator 12. It will be noted that this last variant is not implemented in the variant shown in FIG. 4, because the circumscribed geometric circle 39 is defined by the tips of the teeth 33 which bear against the lateral surfaces 38A and 38B of the pallets.

Figure 8:
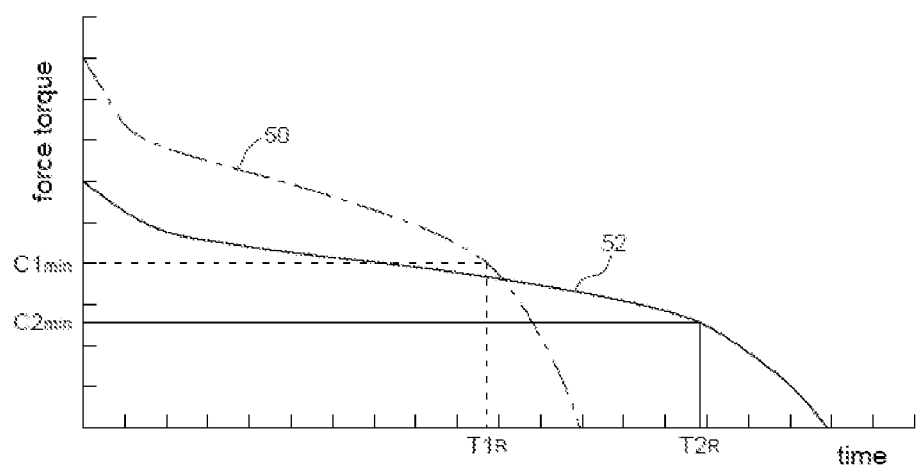
FIG. 8 is a graph showing the force torque provided to an hour wheel by a conventional barrel incorporated in a mechanical movement and the force torque provided to this hour wheel by the same barrel incorporated in the horological movement of FIG. 1.

Thanks to the concept of the invention which proposes a power supply for the electromechanical oscillator, the barrel 8 does not have to power supply this oscillator so that the mechanical power that the barrel must provide is much less than in a conventional mechanical movement wherein the oscillator generally consumes a large part of the energy, in particular when the display is limited to an hour display with two or three hands, optionally with the analogue display of the date. In addition, the minimum mechanical torque required to drive the gear train and the analogue display is less than in a conventional mechanical movement where the barrel must be able to exert a force torque on the lever so as to maintain the oscillation of the mechanical resonator. FIG. 8 graphically shows the force torque as a function of time for a conventional movement (curve 50) and for a horological movement according to the first embodiment of the invention (curve 52) wherein the transmission ratio between the barrel and an hour wheel of the analogue display has been increased, for the same barrel, in relation to a corresponding mechanical movement (that is to say with a conventional Swiss lever escapement and a usual balance-spring). The amount of energy in the barrel remains the same, but the power reserve is increased because the minimum torque $C1_{min}$ for the conventional mechanical movement is much higher than the minimum torque $C2_{min}$ for the horological movement 2 according to the invention. There is thus a transition from a power reserve $T1_R$ to a power reserve $T2_R$, $T2_R$ possibly being two to three times greater than $T1_R$, for example. In an advantageous variant, the transmission ratio between the barrel and the hour wheel of the analogue display 4 is substantially equal to or greater than 6/5 (120%). In a preferred variant, this transmission ratio is substantially equal to or greater than 9/5 (180%).

Figure 7:
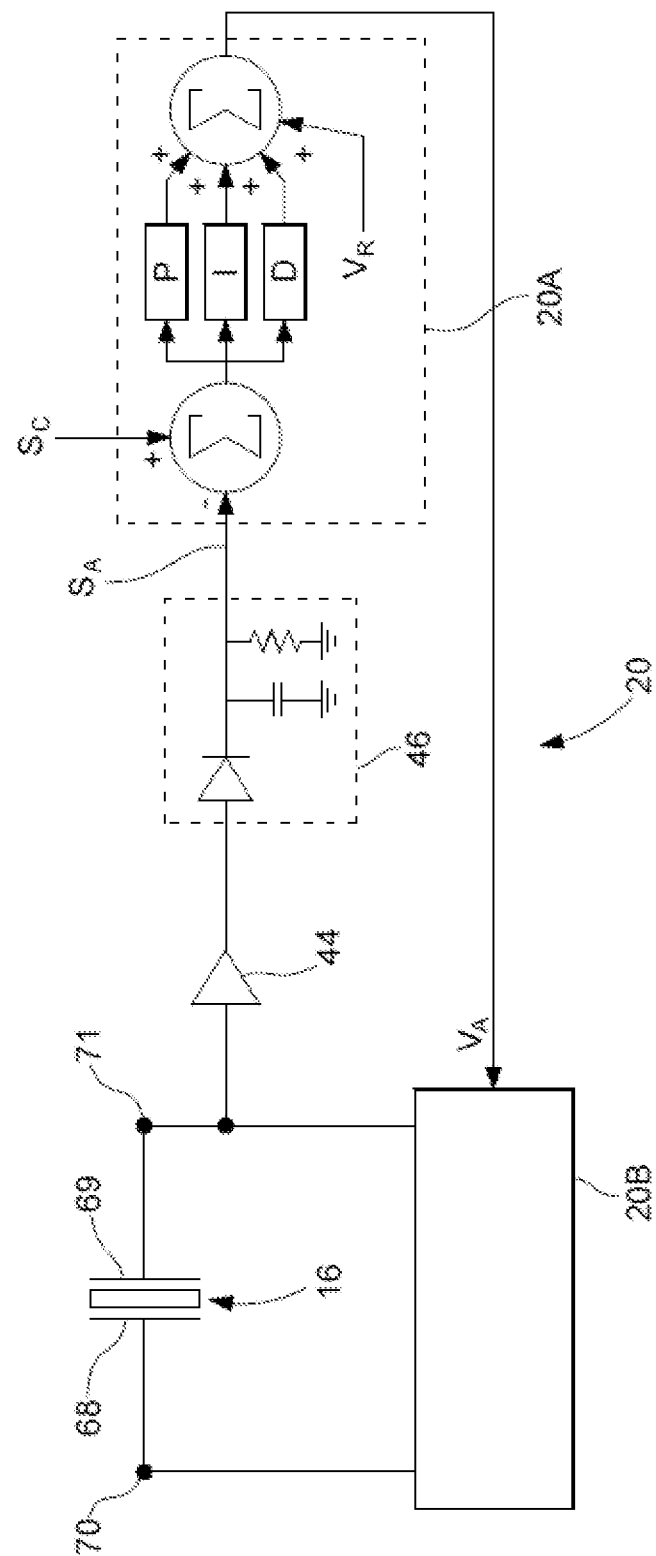
FIG. 7 is a schematic representation of the electronic control circuit of the electromechanical oscillator incorporated in the embodiment of the horological movement of FIG. 1.

FIG. 7 shows a preferred embodiment of the electronic control circuit 20 which is arranged to be able to control the application of an electrical supply voltage to at least one terminal/electrode of the piezoelectric spring so as to maintain the amplitude of the functional oscillation of the resonator 12/oscillator 14 substantially constant, regardless in particular of the spatial orientation of the horological movement according to the invention, in particular of its resonator 12. The electronic control circuit comprises a peak voltage detector 46, arranged to be able to substantially detect the amplitude of the voltage induced in the piezoelectric spring 16 when the resonator 12 oscillates, and a regulation circuit 20A which receives from the peak voltage detector a signal $S_A$ relating to the amplitude of the induced voltage and which is arranged to manage a power supply voltage $V_A$, supplied to the piezoelectric spring through a phase locked loop 20B, according to a setpoint value $S_C$ for the signal $S_A$ supplied by the peak voltage detector, so as to obtain an oscillation of the resonator with a substantially constant amplitude. The setpoint value $S_C$ corresponds to a setpoint amplitude provided for the oscillation of the resonator 12. The regulation circuit 20A comprises processing parts P, I, D arranged in parallel and well known to the person skilled in the art, which process a difference between the setpoint value $S_c$ and the value of the amplitude signal $S_A$ by a proportional response, respectively as a function of an integration and a derivation of this difference over time. The regulation circuit also receives a reference voltage $V_R$ which is adjusted according to the regulation carried out by the circuit 20A. Finally, to isolate the piezoelectric spring from the peak voltage detector and from the regulation circuit and avoid disturbing its power supply, a buffer element 44 (high input impedance transistor) is provided upstream of the peak voltage detector.

In a main embodiment, the phase locked loop 20B servo-controls the phase of the periodic power supply signal to the phase of the induced voltage signal, supplied in particular to the terminal 71, so that the power supply voltage constrains the piezoelectric spring in the direction of its movement, which is either in contraction or in extension according to the alternation in progress. For example, circuit 20B detects zero crossings of the induced voltage, in particular at the terminal 71. Thus, for the impulses to be driving impulses, the polarity of the supply voltage is selected so as to constrain the piezoelectric spring in the direction of its movement, which is alternately in extension and in contraction during the alternations of the oscillation of the resonator.

In a particular embodiment, a quartz oscillator is incorporated in the electronic control circuit 20. This quartz oscillator can be used for various needs. In particular, the management of the supply voltage $V_A$ can comprise a modulation of the driving impulses with a variable duty ratio depending on the amplitude signal $S_A$ and the setpoint value $S_C$, in particular their difference. In an advantageous variant of this particular embodiment, the driving impulses are triggered with a setpoint frequency $F_c$ for the oscillator 10/the resonator 12 which is determined very precisely by the quartz oscillator. If the frequency $F_S$ of the power supply signal is not too far from the resonant frequency of the resonator, namely from its natural frequency $F_N$, from double this natural frequency or possibly from an integer division of this double frequency, such a power supply of the piezoelectric spring can impose the setpoint frequency on the resonator 12 maintained by said driving impulses by ensuring sufficient amplitude for a functional oscillation, even for an electric energy supply managed so as to optimise its consumption, so that the electromechanical oscillator 10 will be able to oscillate at the setpoint frequency, with the precision of quartz, and a functional amplitude regardless of the spatial orientation of the horological movement.

The advantageous variant described above can be easily implemented to obtain a gain in precision for the running of the horological movement, and therefore of the watch which incorporates it, almost without increasing the electricity consumption related to maintaining a functional oscillation. It will be noted that, in this advantageous variant, the power supply circuit does not need to comprise a phase locked loop; which simplifies its design.

By combining the aforementioned advantageous variant with the preferred variant of the electronic control circuit which has been described above, there is a sort of double regulation of the oscillation frequency of the electromechanical oscillator, namely a first amplitude regulation which tends to keep the amplitude of oscillation constant, regardless of the spatial orientation of the horological movement, thus reducing the variation of the natural frequency of the resonator in connection with the spatial orientation of the horological movement, so that this natural frequency remains close to the setpoint frequency $F_c$ for any possible spatial orientation as soon as an initial adjustment is carried out correctly, and a second regulation obtained by the generation of driving electrical impulses at the setpoint frequency or more generally with time intervals between the driving impulses whose value $D_T$ is equal to an integer N multiplied by half the setpoint period Tc (Tc=1/Fc), that is to say a mathematical relationship $D_T=N \cdot Tc/2$, N being greater than zero. The number N, which can be variable, is provided small enough to ensure maintaining a functional oscillation and it is selected from a range of values allowing to impose the setpoint frequency Fc on the electromechanical oscillator, this range of values being a function of the range of possible natural frequencies for this oscillator, which is kept sufficiently close to the setpoint frequency thanks to the aforementioned first regulation. Thus, as the first amplitude regulation allows to minimise a maximum difference between the natural frequency $F_N$ of the electromechanical oscillator and the setpoint frequency, regardless of the orientation of the horological movement, the second regulation by a periodic power supply signal determined by the quartz oscillator, in particular by driving impulses at the setpoint frequency $F_C$, is guaranteed with a relatively large functional amplitude, provided that the number N is not too high. There is thus a precision of the running of the horological movement which is equal to that of the quartz oscillator for any spatial orientation of the horological movement.

The advantageous variant of the particular embodiment may, in another implementation, not be combined with the preferred variant of the electronic control circuit, the amplitude regulation not being provided and the frequency of the electromechanical oscillator being imposed by the generation of driving electric impulses at a frequency $F_s=2 \cdot Fc/N$. In the latter case, so that the frequency of the driving electric impulses can impose the setpoint frequency Fc on the electromechanical oscillator, these driving electric impulses are preferably dimensioned so that their frequency corresponds to a small number N, for example N=1 or N=2. Note that an even number N is preferable because the supply voltage can then keep the same polarity. In this simplified variant, the power supply circuit does not need to comprise a phase locked loop. On the other hand, in the particular embodiment, whether it is the advantageous variant or the simplified variant which is implemented, a quartz oscillator is incorporated in the electronic control circuit of the power supply device.

Note that in another embodiment, a quartz oscillator is added to the electronic control circuit to allow regulation of the oscillation of the balance-spring so that its average frequency is regulated and determined by a reference frequency generated by the quartz oscillator.

Figure 3:
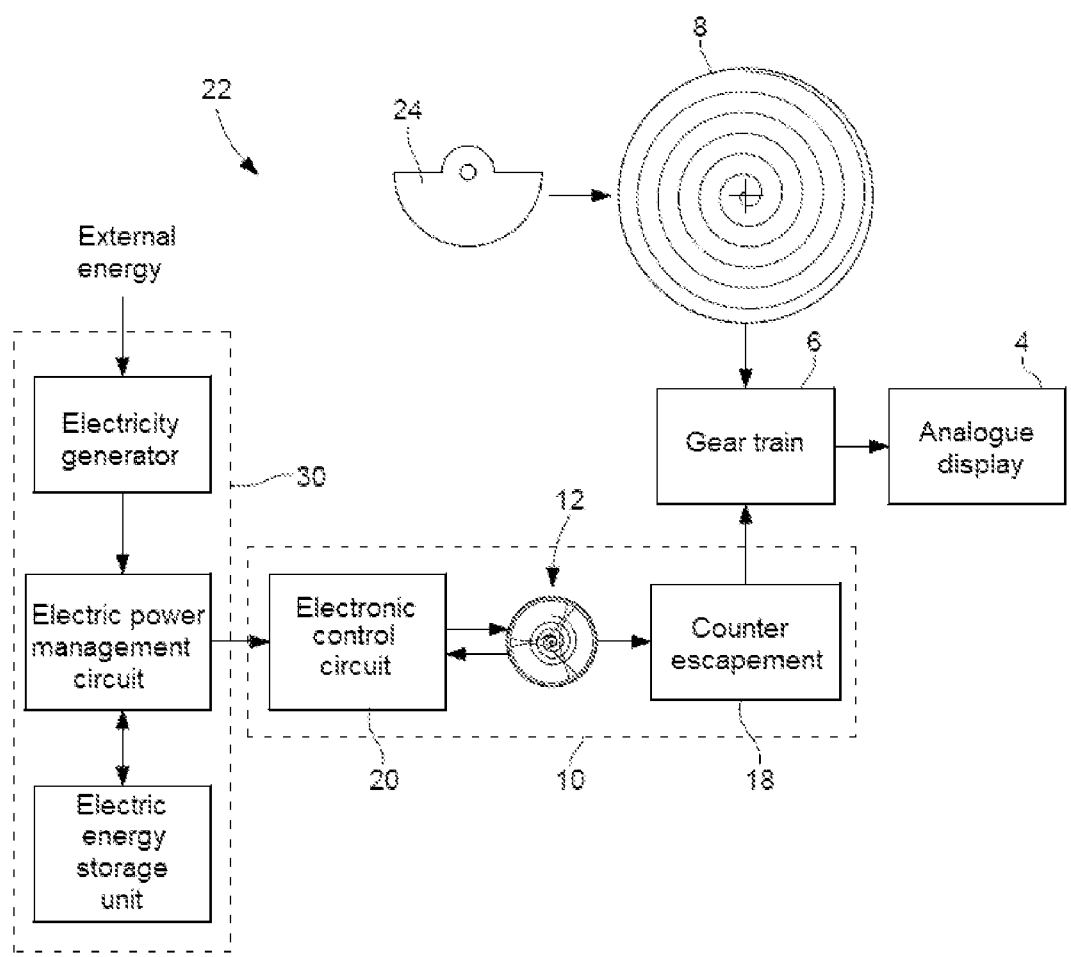
FIG. 3 is a schematic representation of a watch according to the invention incorporating a horological movement according to the invention.

FIG. 3 schematically shows a watch 22 according to the invention comprising a horological movement according to the invention. The parts of the horological movement already described will not be described again here in detail. The watch 22 comprises an electric energy source 30 which is formed by an electricity generator arranged to produce electricity so as to allow the electronic control circuit and the piezoelectric spring to be power supplied. In the variant shown, the electricity generator is connected to a storage unit, in particular a rechargeable battery or a supercapacitor, via a circuit for managing the electric power supplied to the electronic control circuit 20 and to the electromechanical oscillator 10. In particular, it will be noted that the voltage necessary to power supply the piezoelectric hairspring is located in a voltage range between 10 V and 40 V. Such a voltage is much higher than the battery voltages generally incorporated in watches and also much higher than the voltages provided by clock-type solar cells. Thus, the electric power management circuit is arranged to be able to increase the voltage accumulated in the storage unit or supplied directly by the electricity generator. For this purpose, it comprises a voltage booster, for example a charge pump.

Various types of electric generators can be provided, in particular at least one solar cell arranged at the dial of the watch or of the bezel of this watch. In another embodiment, a thermopile is provided which receives thermal energy from the user's arm as energy external to the watch. The thermopile is thus arranged in such a way as to be able to convert heat from the body of a user into electricity. Finally, it will be noted that in another embodiment, the watch according to the invention does not comprise an electric generator which makes it autonomous, but it comprises a battery in the form of a conventional cell.

The invention claimed is:

1. A horological movement comprising:
an analogue time display, a gear train, a barrel driving the analogue display via the gear train, and an oscillator formed of a resonator, comprising a balance and a piezoelectric spring, and a mechanical escapement coupling the balance to the gear train, the piezoelectric spring being formed at least partially of a piezoelectric material and comprising at least two electrodes at least one electrode of which is connected to an electronic control circuit, the piezoelectric material and said at least one electrode being arranged so as to allow the application, managed by the electronic control circuit, of an electrical stress on the piezoelectric spring;
wherein the electronic control circuit is arranged to be able to be connected to an electric energy source and to be able to control the application, at least occasionally, of a power supply voltage to said at least one electrode so as to excite the oscillator to obtain a functional oscillation of the resonator and then to maintain said functional oscillation; and
wherein the mechanical escapement is configured so as to be an escapement for counting the alternations of the functional oscillation, thus in order to pace the running of the horological movement, without the resonator being able to receive from the barrel via said mechanical escapement enough mechanical energy to maintain the functional oscillation.

2. The horological movement according to claim 1, wherein the electronic control circuit is arranged to control said application of an electrical supply voltage so as to maintain the amplitude of the functional oscillation substantially constant.

3. The horological movement according to claim 2, wherein the electronic control circuit comprises a peak voltage detector, which is arranged to be able to substantially detect the amplitude of a voltage induced in the piezoelectric spring when the resonator oscillates, and a regulation circuit which receives from the peak voltage detector a signal relating to the amplitude of the induced voltage and which is arranged to be able to manage a power supply voltage according to a setpoint value for said signal supplied by the peak voltage detector, so as to obtain an oscillation of the resonator with a substantially constant amplitude.

4. The horological movement according to claim 2, wherein a transmission ratio between the barrel and an hour wheel of said analogue display is equal to or greater than 6/5.

5. The horological movement according to claim 2, wherein a transmission ratio between the barrel and an hour wheel of said analogue display is equal to or greater than 9/5.

6. A watch comprising a horological movement according to claim 2, wherein the energy source is incorporated in said watch and comprises an electricity generator arranged to produce electricity so as to allow the electronic control circuit and the piezoelectric spring to be power supplied.

7. The watch according to claim 6, wherein the electricity generator comprises a light sensor.

8. The watch according to claim 6, wherein the electricity generator comprises a thermopile arranged to convert heat from the body of a user into electricity.

9. The horological movement according to claim 1, wherein a transmission ratio between the barrel and an hour wheel of said analogue display is equal to or greater than 6/5.

10. The horological movement according to claim 1, wherein a transmission ratio between the barrel and an hour wheel of said analogue display is equal to or greater than 9/5.

11. The horological movement according to claim 1, wherein the mechanical escapement is configured so as to be an escapement only for counting the alternations of the functional oscillation; and wherein the electronic control circuit is arranged to be able to maintain said functional oscillation alone.

12. The horological movement according to claim 11, wherein the escapement is a Swiss lever escapement includes two pallets, and the two pallets of the Swiss lever each have, at their free end intended to momentarily stop an escape wheel, an end surface whose point of contact with a circle circumscribed to the escape wheel, when one of the two pallets is in a corresponding angular position, is located at the junction between said end surface and a lateral surface of one of the two pallets forming a stop for teeth of the escape wheel.

13. The horological movement according to claim 11, wherein said horological movement is provided with an oscillating mass to automatically wind the barrel.

* * * * *